United States Patent
Kim et al.

(10) Patent No.: US 9,324,963 B2
(45) Date of Patent: Apr. 26, 2016

(54) ORGANIC LIGHT EMITTING DISPLAY DEVICE

(71) Applicant: LG Display Co., Ltd., Seoul (KR)

(72) Inventors: Ho Sung Kim, Suwon-si (KR); Kwang Hyun Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/581,839

(22) Filed: Dec. 23, 2014

(65) Prior Publication Data

US 2015/0188075 A1    Jul. 2, 2015

(30) Foreign Application Priority Data

Dec. 31, 2013    (KR) .................. 10-2013-0169365

(51) Int. Cl.
  *H01L 31/12*    (2006.01)
  *H01L 27/32*    (2006.01)
  *H01L 51/50*    (2006.01)

(52) U.S. Cl.
  CPC ........ *H01L 51/5064* (2013.01); *H01L 27/3211* (2013.01); *H01L 51/5004* (2013.01); *H01L 51/508* (2013.01)

(58) Field of Classification Search
  CPC ......... H01L 31/12; H01L 27/32; H01L 33/00; H01L 33/08; H01L 27/15; H01L 51/50
  See application file for complete search history.

(56) References Cited

U.S. PATENT DOCUMENTS

| | | | |
|---|---|---|---|
| 2007/0152573 A1* | 7/2007 | Kim et al. | 313/506 |
| 2012/0119191 A1* | 5/2012 | Dorok et al. | 257/40 |
| 2013/0126845 A1* | 5/2013 | Morikawa et al. | 257/40 |
| 2013/0140533 A1* | 6/2013 | Lee et al. | 257/40 |
| 2014/0001444 A1* | 1/2014 | Kim et al. | 257/40 |

* cited by examiner

*Primary Examiner* — Mohammad Choudhry
(74) *Attorney, Agent, or Firm* — Birch, Stewart, Kolasch & Birch, LLP

(57) ABSTRACT

An organic light emitting display device is disclosed which includes: a first electrode including red, green and blue subpixel regions; a first hole injection layer disposed on the first electrode; a first hole transport layer disposed on the hole injection layer; second, third and fourth hole transport layers arranged on the first hole transport layer corresponding to the red, green and blue regions, respectively; an organic emission layer disposed on the second, third and fourth hole transport layers; an electron transport layer disposed on the organic emission layer; and a second electrode disposed on the electron transport layer, the second, third and fourth hole transport layers each having a hole mobility different from an electron mobility of the electron transport layer.

20 Claims, 8 Drawing Sheets

<LIFE TIME CHARACTERISTIC>

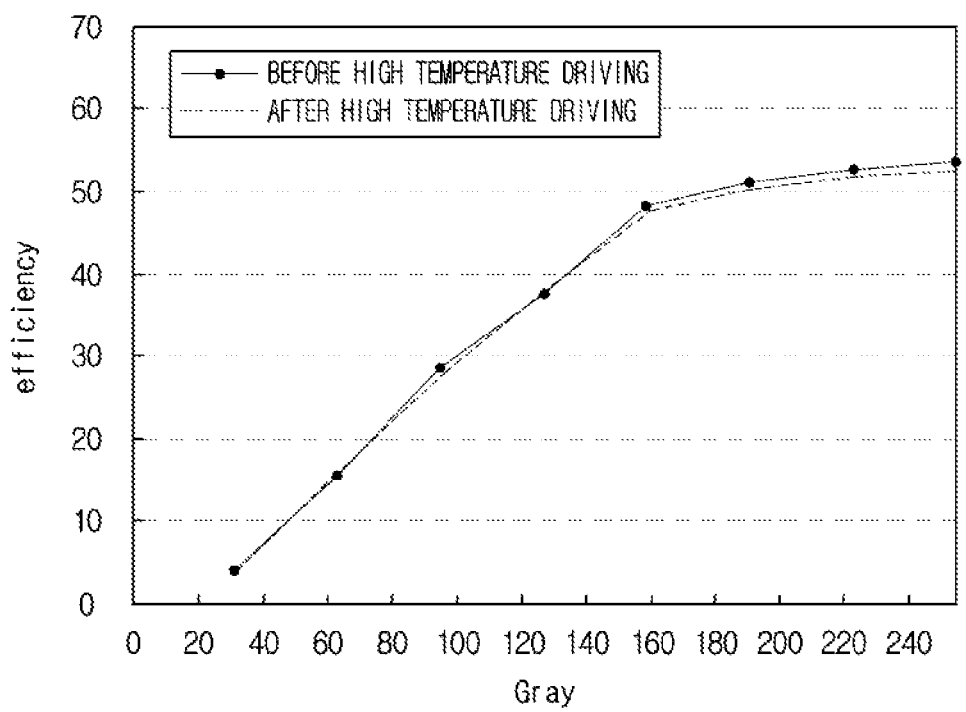

ORGANIC LIGHT EMITTING DISPLAY DEVICE

CROSS-REFERENCE TO RELATED APPLICATION

The present application claims priority to and the benefit under 35 U.S.C. §119(a) of Korean Patent Application No. 10-2013-0169365 filed on Dec. 31, 2013, which is hereby incorporated by reference for all purposed as if fully set forth herein.

BACKGROUND OF THE INVENTION

1. Field of the Disclosure

The present application relates to an organic light emitting display device. More particularly, the present application relates to an organic light emitting display device adapted to enhance high temperature reliability and expand life time of elements by adjusting hole and electron mobilities of a hole transport layer and an electron transport layer which are formed in an organic light emitting diode.

2. Description of the Related Art

An organic light emitting diode used in an organic light emitting display device is a self-luminous element which includes an emission layer formed between two electrodes. The organic light emitting diode generates excitons by injecting electrons and holes into the emission layer through an electron injection electrode (i.e., a cathode) and a hole injection electrode (i.e., an anode) and recombining the electrodes and the holes within the emission layer. Also, the organic light emitting diode emits light when the excitons are transitioned from an excited state into a ground state.

The organic light emitting display device using the organic light emitting diode is classified into a top-emission mode, a bottom-emission mode and a dual-emission mode according to the light emission directions. Also, the organic light emitting display device can be divided into a passive matrix type and an active matrix type.

In order to display an image, the organic light emitting display device can apply scan signals, data signals and supply voltages to a plurality of sub-pixels, which is arranged in a matrix shape, and enable selected sub-pixels to emit light.

Also, in order to enhance luminous efficiency and color coordination of a display panel, organic light emitting display devices with a micro-cavity structure which allows red, green and blue sub-pixels to be formed differently from one another in thickness have been developed.

FIG. 1 is a cross-sectional view showing the structure of an organic light emitting diode which is formed in a sub-pixel region of an organic light emitting display device according to the related art.

The organic light emitting diode shown in FIG. 1 corresponds to an organic electronic element which converts electrical energy into light energy. Such an organic light emitting diode includes an organic emission layer EML interposed between an anode electrode E1 and a cathode electrode E2 and configured to emit light. The anode electrode E1 is used to inject holes, and the cathode electrode E2 is used to inject electrons.

The electrons and the holes injected from the two electrodes E1 and E2 are drifted into the organic emission layer EML and form excitons. The electrical energy of the excitons is converted into visible light so that visible light is emitted. In order to easily and smoothly inject the electrons and the holes from the two electrodes E1 and E2 into the organic emission layer EML, not only a hole injection layer HIL and a hole transport layer HTL are formed between the organic emission layer EML and the anode electrode E1, but also an electron transport layer ETL and an electron injection layer (EIL; not shown) are formed between the organic emission layer EML and the cathode electrode E2.

In general, an electrical charge distribution zone where holes and electrons exist is formed within the organic emission layer EML of the organic light emitting diode. Also, the electrical charge density has the largest value in the central region (or axis, hereinafter 'peak electrical-charge density region (or axis)') of the electrical charge distribution zone and is gradually lowered as it goes to edges of the electrical charge distribution zone.

With the exception of the electrical charge distribution, a hole-electron recombination zone, in which the holes and the electrodes are recombined with each other, is formed within the organic emission layer EML. The organic light emitting diode is generally manufactured in such a manner that the central region (or axis) of the hole-electron recombination zone overlaps with the peak electrical-charge density region (or axis). The central region (or axis) of the hole-electron recombination zone corresponds to the highest region (or an axis; hereinafter 'peak recombination density region (or axis)') of the density of holes and electrons which will be recombined with each other.

The peak electrical-charge density region (or axis) can be fixed to the central region (or axis) of the organic emission layer EML according to the formation material of the organic emission layer EML. The hole-electron recombination zone can be shifted by dispersion degrees of the holes and electrons which are drifted into the organic emission layer EML for the recombination with each other.

In order to overlap the peak recombination density region (or axis) with the peak electrical-charge density region (or axis), the organic light emitting diode generally allows the organic emission layer EML and the hole and electron transport layers HTL and ETL to be adjusted in thickness.

FIG. 2 is a graph illustrating a life time characteristic of an organic light emitting diode according to the related art. FIG. 3 is a graph illustrating a brightness characteristic of an organic light emitting diode according to the related art after a high temperature reliability inspection.

As seen from FIGS. 2 and 3, it is clear that the life time of a red organic light emitting diode is reduced with the lapse of time, and brightness of the red organic light emitting diode after a high temperature reliability inspection gradually deteriorates with the lapse of time.

In the drawings, a characteristic curve '-●-:Red' represents variations of the current efficiency (cd/A) of the organic light emitting diode, which is driven at the room temperature, with the lapse of time. Another characteristic curve '---:R-after 240 Hr' represents variations of the current efficiency (cd/A) of the organic light emitting diode which is driven at a high temperature, with the lapse of time. Based on the comparison between the two current efficiency characteristic curves, it is clear that the current efficiency of the organic light emitting diode deteriorates after a high temperature reliability inspection.

The current efficiency of the organic light emitting diode affects brightness of the organic light emitting diode. Due to this, the brightness of the organic light emitting diode also deteriorates after the high temperature reliability inspection.

The inventors of the present application have found out that this deterioration results from the fact that the organic emission layer of the organic light emitting diode is formed in an overlapping shape of the peak recombination density region (or axis) and the peak electrical-charge density region (or axis), and the hole-electron recombination zone tends to expand toward low electrical-charge regions when the organic light emitting diode is driven.

SUMMARY OF THE INVENTION

Accordingly, embodiments of the present application are directed to an organic light emitting display device and a fabricating method thereof that substantially obviate one or more of problems due to the limitations and disadvantages of the related art.

The embodiments are to provide an organic light emitting display device which is adapted to enhance the light efficiency and expand the life time by preventing an overlap between a peak charge density position and a peak recombination position within an organic emission layer using difference between hole mobility of a hole transport layer of an organic light emitting diode and electron mobility of an electron transport layer of the organic light emitting diode.

Also, the embodiments are to provide an organic light emitting display device which allows a recombination region of an organic emission layer to be enlarged toward a high charge density region by a difference between hole mobility of the hole transport layer and electron mobility of an electron transport layer when an organic light emitting diode is driven so that high temperature reliability is enhanced and the life time of elements is expanded.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

In order to solve the above-mentioned problems of the related art, an organic light emitting display device according to a general aspect of the present embodiment includes: a first electrode including red, green and blue sub-pixel regions; a first hole injection layer disposed on the first electrode; a first hole transport layer disposed on the hole injection layer; second, third and fourth hole transport layers arranged on the first hole transport layer corresponding to the red, green, and blue regions, respectively; an organic emission layer disposed on the second, third and fourth hole transport layers; an electron transport layer disposed on the organic emission layer; and a second electrode disposed on the electron transport layer, wherein the second, third and fourth hole transport layers each have a hole mobility different from an electron mobility of the electron transport layer.

An organic light emitting display device according to another general aspect of the present embodiment includes: a first electrode including red, green and blue sub-pixel regions; a first hole injection layer disposed on the first electrode; a first hole transport layer disposed on the hole injection layer; second, third and fourth hole transport layers arranged on the first hole transport layer corresponding to the red, green, and blue regions and formed in a stacked structure of a plurality of transport layers; an organic emission layer disposed on the second, third and fourth hole transport layers; an electron transport layer disposed on the organic emission layer and formed in a stacked structure of a plurality of layers; and a second electrode disposed on the electron transport layer, wherein the second, third and fourth hole transport layers each have a hole mobility different from an electron mobility of the electron transport layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings:

FIG. 9 is a graph illustrating a brightness characteristic of an organic light emitting diode in accordance with one embodiment of the present disclosure after a high temperature reliability inspection;

FIG. 10 is a table illustrating a quantum efficiency characteristic of an organic light emitting diode in accordance with one embodiment of the present disclosure;

DETAILED DESCRIPTION OF THE ILLUSTRATED EMBODIMENTS

Figure 1:
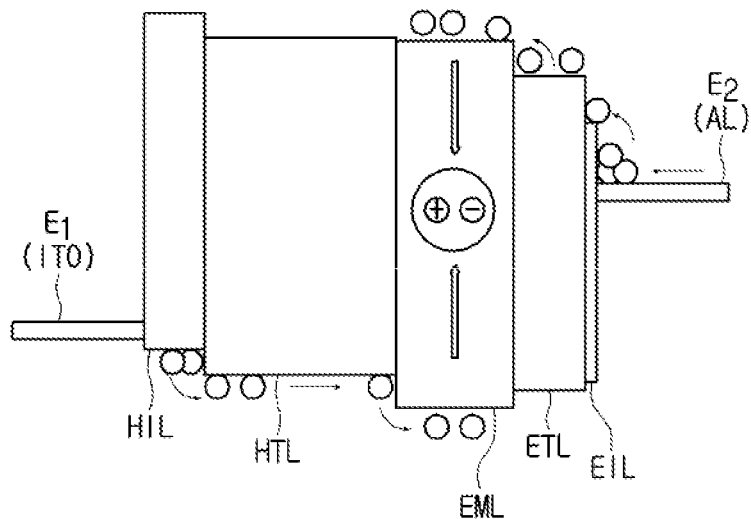
FIG. 1 is a cross-sectional view showing the structure of an organic light emitting diode which is formed in a sub-pixel region of an organic light emitting display device according to the related art.
Figure 2:
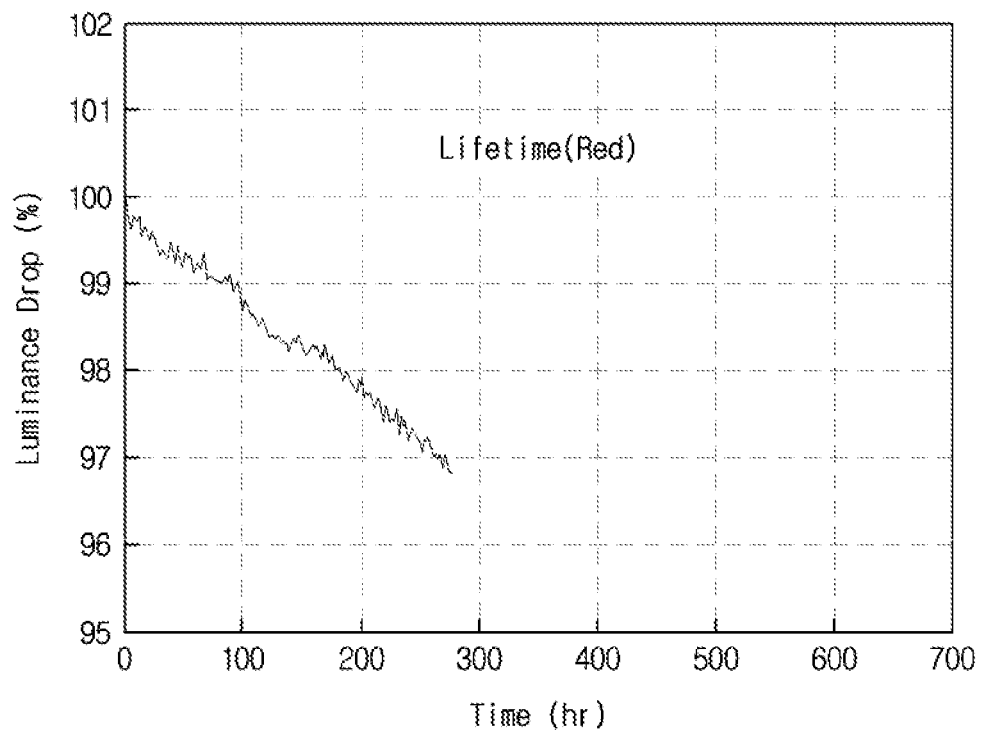
FIG. 2 is a graph illustrating a life time characteristic of an organic light emitting diode according to the related art.
Figure 3:
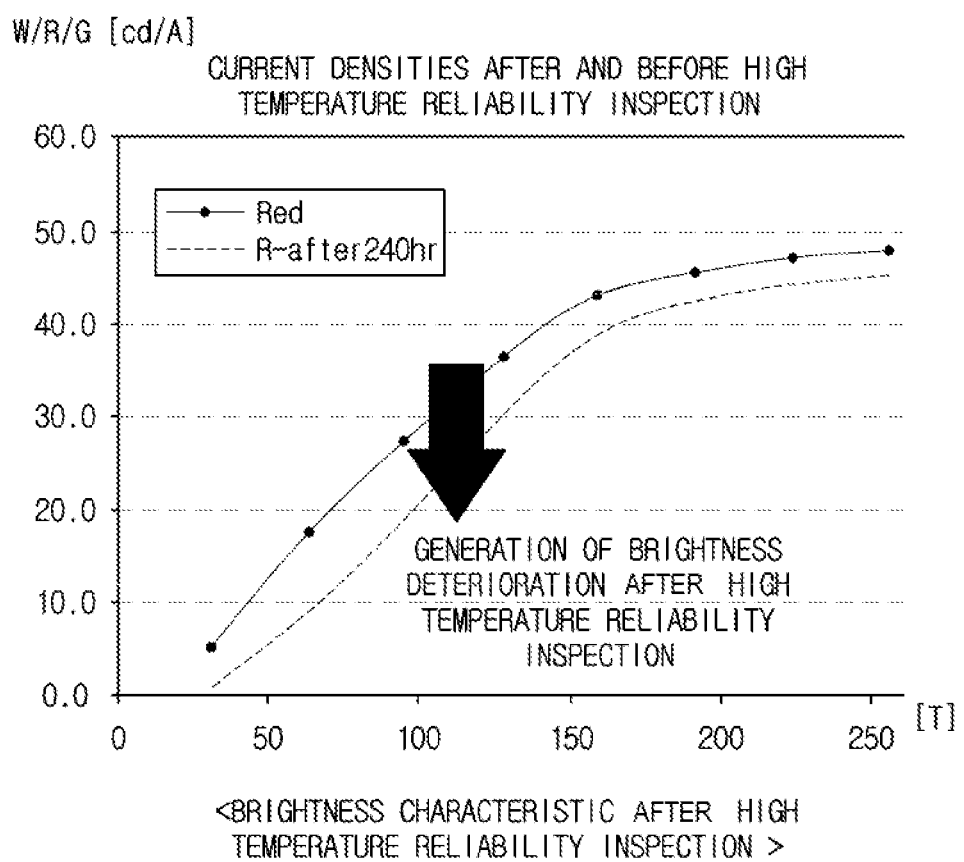
FIG. 3 is a graph illustrating a brightness characteristic of an organic light emitting diode according to the related art after a high temperature reliability inspection.

Reference will now be made in detail to the embodiments of the present invention, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

The organic light emitting display device according to one embodiment of the present disclosure includes a timing controller, a data driver, a scan driver and a display panel.

The timing controller receives a vertical synchronous signal, a horizontal synchronous signal, a data enable signal, a clock signal and a data signal from an external system such as an image processor. Also, the timing controller controls operational timings of the data driver and the scan driver using the timing signals such as the vertical synchronous signal, the horizontal synchronous signal, the data enable signal, the clock signal and so on.

The data driver samples the data signal applied from the timing controller and latches the sampled data signal, in response to data timing control signals applied from the timing controller. As such, a serial data signal can be converted into a parallel data signal. Also, the data driver converts the parallel digital data signal into analog data signals using gamma reference voltages. The converted analog data signals are applied from the data driver to sub-pixels on the display panel through data lines.

The scan driver sequentially generates scan signals in response to gate timing control signals. Also, the scan driver applies the scan signals to the sub-pixels on the display panel through scan lines.

The display panel includes the sub-pixels arranged in a matrix shape. The sub-pixels can include red, green and blue sub-pixels. Alternatively, the sub-pixels can include white sub-pixels and a color conversion layer configured to convert white light emitted from the white sub-pixels into red, green and blue lights. Also, the sub-pixel can be configured in one of a passive type and an active type. For example, the active type sub-pixel includes: a switching transistor configured to transfer a data signal in response to a scan signal; a capacitor configured to store a data voltage corresponding to the data signal; a driving transistor configured to generate a driving current corresponding to the data voltage; and an organic light emitting diode configured to emit light corresponding to the driving current. In this manner, the active type sub-pixel can be configured in a 2T1C (two transistors and one capacitor) structure which includes the switching transistor, the driving transistor, the capacitor and the organic light emitting diode. Alternatively, the active type sub-pixel can be configured to further include at least one transistor and at least one capacitor as one of a 3T1C structure, a 4T2C structure, a 5T2C structure and so on. Moreover, the sub-pixel can be formed in one of a top-emission mode, a bottom-emission mode and a dual-emission mode according to a light emitting direction.

In order to enhance luminous efficiency and color coordination, the sub-pixel included in the display panel is formed in one of a micro-cavity structure and a stack structure. The sub-pixel with one of the micro-cavity structure and the stack structure will now be described in detail.

Figure 4:
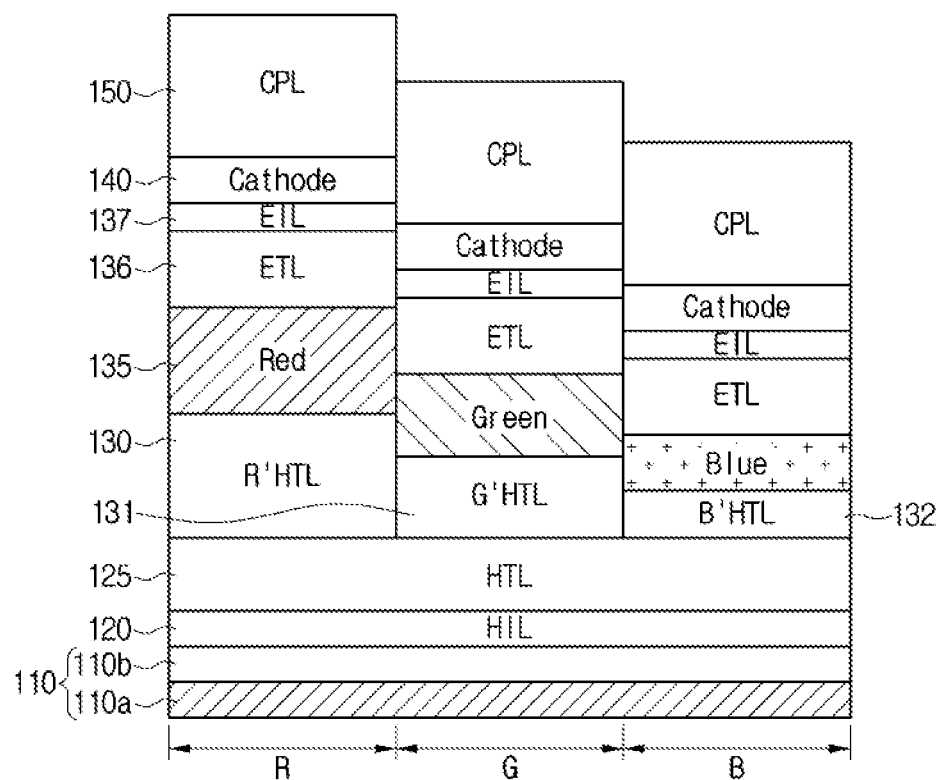
FIG. 4 is a cross-sectional view showing the structure of an organic light emitting display device according to a first embodiment of the present disclosure.

FIG. 4 is a cross-sectional view showing a structure of an organic light emitting display device according to a first embodiment of the present disclosure.

Referring to FIG. 4, the organic light emitting display device according to a first embodiment of the present disclosure includes a first electrode 110 formed on a substrate, which is defined into red, green and blue sub-pixel regions, and used as a reflective electrode. Also, the organic light emitting display device includes a hole injection layer (HIL) 120 and a first hole transport layer (HTL) 125 stacked on the first electrode 110 corresponding to all the red, green and blue sub-pixel regions.

The first electrode 110 can be used as an anode electrode of an organic light emitting diode. Also, the first electrode 110 can be formed by stacking a second metal layer 110*b* of a transparent conductive material on a first metal layer 110*a* with high reflectance. The first metal layer 110*a* can be formed from one of aluminum Al and silver Ag. The second metal layer 110*b* can be formed from one of ITO (indium tin oxide) and IZO (indium zinc oxide).

The hole injection layer 120 can be formed from one selected from a material group which includes arylamine based compounds, such as NATA, 2T-NATA and NPNPB, and p-doped materials such as F4-TCNQ and PPDN, but it is not limited to this.

The first hole transport layer (HTL) 125 can be formed of one selected from a material group of arylamine based compounds, starburst-aromatic-amine-based-materials, spiro-ladder type materials, NPD (N,N-dinaphthyl-N,N'-diphenyl benzidine), s-TAD and MTDATA (4,4',4''-tris(N-3-methylphenyl-N-phenyl-amino)-triphenylamine), but it is not limited to this. The arylamine-based compounds can include TPD (N,N'-bis-(3-methylphenyl)-N,N'-bis-(phenyl)-benzidine), PPD, TTBND, FFD, p-dmDPS and TAPC. The starburst-aromatic-amine-based materials can include TCTA, PTDATA, TDAPB, TDBA, 4-a and TCTA. The spiro-ladder type materials can include spiro-TPD, spiro-mTTB and spiro-2.

A second hole transport layer (R'HTL) 130, a third hole transport layer (G'HTL) 131 and a fourth hole transport layer (B'HTL) 132 can be formed on the first hole transport layer (HTL) 125 corresponding to the respective red, green and blue sub-pixel regions. The second, third and fourth hole transport layers (R'HTL, G'HTL and B'HTL) 130, 131 and 132 can be formed differently from one another in thickness.

Such second, third and fourth hole transport layers (R'HTL, G'HTL and B'HTL) 130, 131 and 132 can be formed of the same material as the first hole transport layer (HTL) 125. Alternatively, the second, third and fourth hole transport layers (R'HTL, G'HTL and B'HTL) 130, 131 and 132 can further contain one of an oligothiophene derivative, an oligocene derivative, a tri-phenylamine derivative and a cabazole derivative, in order to adjust their hole mobility.

Also, each of the second, third and fourth hole transport layers (R'HTL, G'HTL and B'HTL) 130, 131 and 132 can be formed of a material with hole mobility of about $3*10-4$ $cm^2/Vs$.

An organic emission layer 135 is formed on the second, third and fourth hole transport layers (R'HTL, G'HTL and B'HTL) 130, 131 and 132 in red, green, and blue sub-pixel regions. The organic emission layer 135 can be formed of a material which emits visible light by receiving holes and electrons and recombining the holes and the electrons.

The organic emission layer 135 can be defined into red, green and blue emission layers which are formed corresponding to the red, green and blue sub-pixel regions. Also, the red, green and blue emission layers can be formed differently from one another in thickness.

The emission layers can be formed of any suitable materials. For example, the emission layers can be formed of one or more of materials with superior fluorescence or phosphorescence quantum efficiency for triplet excitons.

As detailed examples of the emission layers, the red emission layer can be formed of a host material, which contains one of CBP (carbazole biphenyl) and mCP (1,3-bis(carbazol-9-yl), and a phosphorescent material containing at least one selected from a dopant material group which includes PIQIr (acac) (bis(1-phenylisoquinoline)acetylacetonate iridium), PQIr(acac) (bis(1-phenylquinoline)acetylacetonate iridium), PQIr (tris(1-phenylquinoline)iridium) and PtOEP (octaethylporphyrin platinum). Alternatively, the red emission layer can include a fluorescent material containing one of PBD:Eu (DBM)3(Phen) and perylene, instead of the above-mentioned phosphorescent material. However, the emission layer is not limited to these.

The green emission layer can be formed from a host material, which contains one of CBP and mCP, and a phosphorescent material containing a dopant such as Ir(ppy)3 (fac-tris (2-phenylpyridine)iridium), Ir(ppy)2(acac) or Ir(mpyp)3. Alternatively, the green emission layer can include a fluorescent material containing Alq3 (tris(8-hydroxyquinolinato) aluminum), instead of the above-mentioned phosphorescent material. However, the green emission layer is not limited to these.

The blue emission layer can be formed of a host material, which contains one of CBP and mCP, and a phosphorescent material containing a dopant material such as (4,6-F2ppy) 2Irpic. Alternatively, the blue emission layer can include a fluorescent material containing one selected from a material group which includes spiro-DPVBi, spiro-6P, distyryl benzene (DSB), distyryl arylene (DSA), PFO-based polymer and PPV-based polymer, instead of the above-mentioned phosphorescent material. However, the blue emission layer is not limited to these.

An electron transport layer (ETL) 136 is formed on the organic emission layer 135. Also, an electron injection layer (EIL) 137 is formed on the electron transport layer (ETL) 136.

The electron transport layer 136 can be used to easily and smoothly transport the electrons. Also, the electron transport layer 136 can be formed of at least one selected from a material group which includes Alq3 (tris(8-hydroxyquinolinato)aluminum), PBD, TAZ, spiro-PBD, BAlq and SAlq, but it is not limited to this.

In order to adjust the electron mobility, the electron transport layer 136 can further contain one of a perylene derivative, tetrathia fulvalene derivative, a fullerene derivative, a diazole derivative and an imidazole derivative.

Such an electron transport layer 136 can be formed of a material with electron mobility of about $6.6*10-8$ cm$^2$/Vs.

Particularly, the organic light emitting display device in accordance with one embodiment of the present disclosure enables a central portion (or a peak point) of a recombination region formed within the organic emission layer 135 not to overlap with a peak charge density point. To this end, the hole mobilities of the second, third and fourth hole transport layers (R'HTL, G'HTL and B'HTL) 130, 131 and 132 can be set differently from the electron mobility of the electron transport layer 136.

A second electrode 140 is formed on the electron injection layer 137. A capping layer (CPL) 150 is formed on the second electrode 140.

The second electrode 140 can be used as a cathode electrode. Also, the second electrode 140 can be formed of a material with low work function, superior conductivity and low resistance. In detail, the second electrode 140 can be formed of one of an alkali metal corresponding to a first group in the periodic table, an alkali earth metal corresponding to a second group in the periodic table and a transition metal. For example, the second electrode 140 can be formed of at least one of silver Ag, aluminum Al, magnesium Mg, lithium Li, calcium Ca, lithium fluoride LiF, indium tin oxide ITO, indium zinc oxide IZO and alloys thereof. Also, the second electrode 140 can be formed in a single layer or a multi-layered structure. However, the second electrode 240 is not limited to these.

The capping layer 150 can be formed from a material such as NPD.

The organic light emitting display device in accordance with one embodiment of the present disclosure can enable a peak electrical-charge density region (or axis) and a peak recombination density region (or axis) within the organic emission layer not to overlap with each other using the difference between the hole and electron mobilities of the hole and electron transport layers of the organic light emitting diode. The peak recombination density region (axis) corresponds to the highest density region of recombined electron-hole pairs.

As such, the peak recombination density region (or axis) of the organic emission layer is formed in such a manner as to be shifted toward an opposite direction to its expansion direction with the peak electrical-charge density region (or axis) as a center. Also, the peak recombination density region expands toward the peak charge density region (or axis) when the organic light emitting diode is driven. In accordance therewith, the light efficiency of the organic light emitting diode can be enhanced and the life time of the organic light emitting diode can be expanded.

Figure 5:
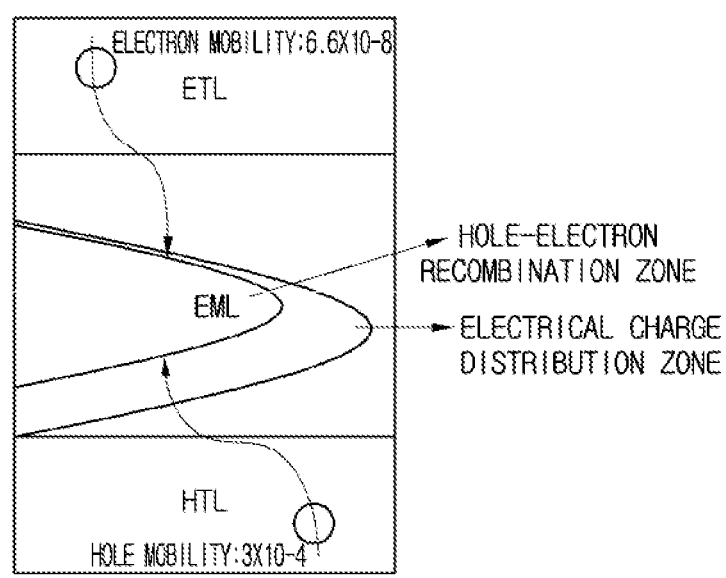
FIG. 5 is a cross-sectional view illustrating an expansion principle of a recombination region within an organic emission layer according to one embodiment of the present disclosure.
Figure 6:
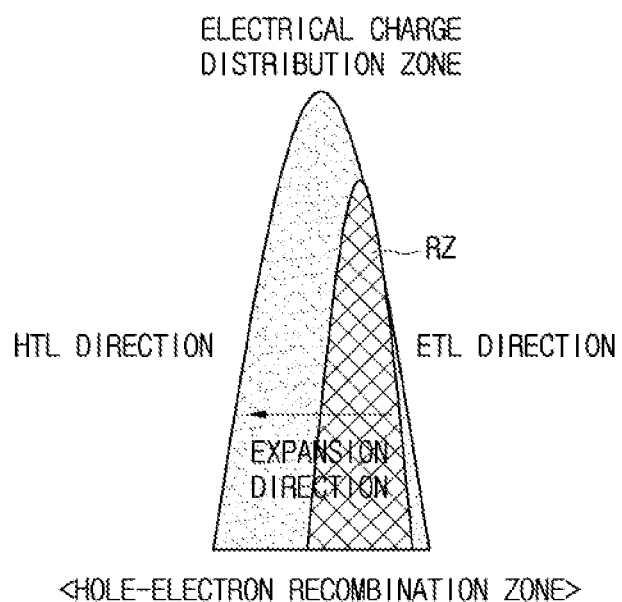
FIGS. 6 and 7 are graphic diagrams illustrating expansion directions of a recombination region by differences between hole and electron mobilities of hole and electron transport layers of the organic light emitting diode in accordance with one embodiment of the present disclosure.
Figure 7:
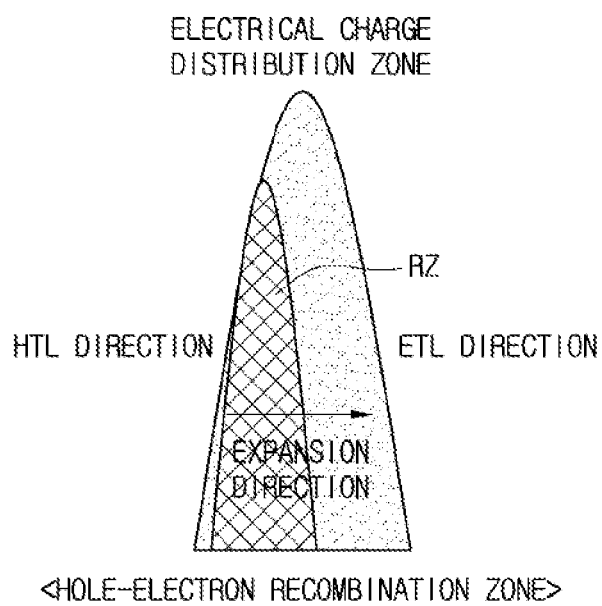

FIG. 5 is a cross-sectional view illustrating an expansion principle of a recombination zone within an organic emission layer according to one embodiment of the present disclosure. FIGS. 6 and 7 are graphic diagrams illustrating expansion directions of a recombination zone by the difference between hole and electron mobilities of hole and electron transport layers of the organic light emitting diode in accordance with one embodiment of the present disclosure.

Referring to FIGS. 5 through 7, the organic light emitting display device according to a first embodiment of the present disclosure uses a difference between the hole mobility of the hole transport layer HTL and the electron mobility of the electron transport layer ETL and enables the center position (or axis) of an electrical charge distribution zone (or a peak electrical-charge density position (or axis)) not to overlap with the center position (or axis) of a hole-electron recombination region (or a peak recombination position (axis)) within the organic emission layer EML.

As shown in FIG. 5, the hole mobility of the hole transport layer HTL corresponding to $3*10-4$ cm$^2$/Vs, for example, is larger than the electron mobility of the electron transport layer ETL corresponding to $6.6*10-8$ cm$^2$/Vs, for example. In this embodiment, the hole-electron recombination zone RZ is formed within the charge distribution zone in such a manner that the center region (or axis) of the hole-electron recombination zone corresponding to the peak recombination density region (or axis) is shifted from a peak electrical-charge density region (or axis) toward the electron transport layer ETL, as shown in FIG. 6.

If the electron mobility of the electron transport layer ETL is larger than the hole mobility of the hole transport layer HTL, the hole-electron recombination zone of the organic emission layer EML is formed within the electrical charge distribution zone in such a manner that peak recombination density region (or axis) is shifted from the peak electrical-charge density position (or axis) toward the hole transport layer HTL.

As such, the electrons and the holes within the central region of the hole-electron recombination zone are recombined with each other and emit light. Also, the electrons and the holes within the rest of the hole-electron recombination zone are drifted toward the peak electrical-charge density region (or axis) and recombined with each other in a similar recombination ratio to the hole-electron recombination ratio of the central region (or axis) of the hole-electron recombination zone. In accordance therewith, the hole-electron recombination ratio of the organic emission layer EML can become higher.

In other words, the organic light emitting display device in accordance with one embodiment of the present disclosure enables the electrons and the holes within not only the central region (or axis) of the hole-electron recombination zone but also the rest of the hole-electron recombination zone to be drifted toward the peak electrical-charge density region (or axis). As such, the hole-electron recombination zone can be enlarged. Therefore, the light efficiency of the organic light emitting diode can be enhanced and the life time of the organic light emitting diode can be expanded.

As shown in FIGS. 6 and 7, the central region (or axis) of the hole-electron recombination zone RZ and the peak electrical-charge density region of the electrical charge distribution zone can be formed within the organic emission layer of the organic light emitting diode in a non-overlapping shape with each other, according to the principle illustrated in FIG. 5.

When the organic light emitting diode with the above-mentioned structure is driven, the hole-electron recombination zone RZ is expanded toward the peak electrical-charge density region (or axis). As such, the light efficiency of the organic light emitting diode can be raised without any decrement. In accordance therewith, the life time of the organic light emitting diode can be expanded and brightness of the organic light emitting diode does not deteriorate after a high temperature reliability inspection.

As shown in FIG. 6, the hole-electron recombination zone RZ can be formed adjacently to the electron transport layer ETL and expanded toward the hole transport layer HTL. To this end, the hole transport layer HTL can be formed to have hole mobility larger than electron mobility of the electron transport layer ETL during the manufacturing of the organic light emitting diode.

In this embodiment, the hole transport layer HTL is formed of a material with a higher hole mobility than the electron mobility of the electron transport layer ETL. The electron transport layer ETL is formed of another material with a lower electron mobility than the hole mobility of the hole transport layer HTL.

On the contrary, the hole-electron recombination zone RZ can be formed adjacently to the hole transport layer HTL and expanded toward the electron transport layer ETL as shown in FIG. 7. To this end, the hole transport layer HTL can be formed to have hole mobility smaller than electron mobility of the electron transport layer ETL during the manufacturing of the organic light emitting diode.

Therefore, the layers included in the organic light emitting diode can be formed of a variety of materials so that the hole mobility of the hole transport layer HTL is set to be different from the electron mobility of the electron transport layer ETL according to one embodiment.

Figure 8:
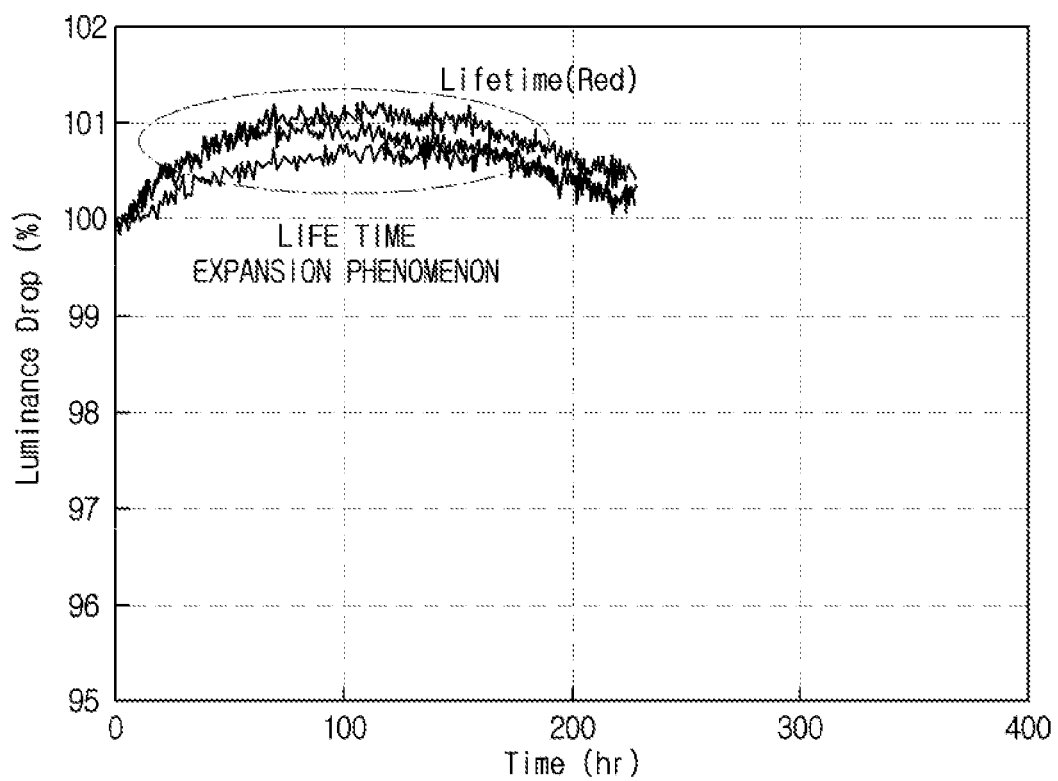
FIG. 8 is a graph illustrating a life time characteristic of an organic light emitting diode in accordance with one embodiment of the present disclosure.
Figure 11:
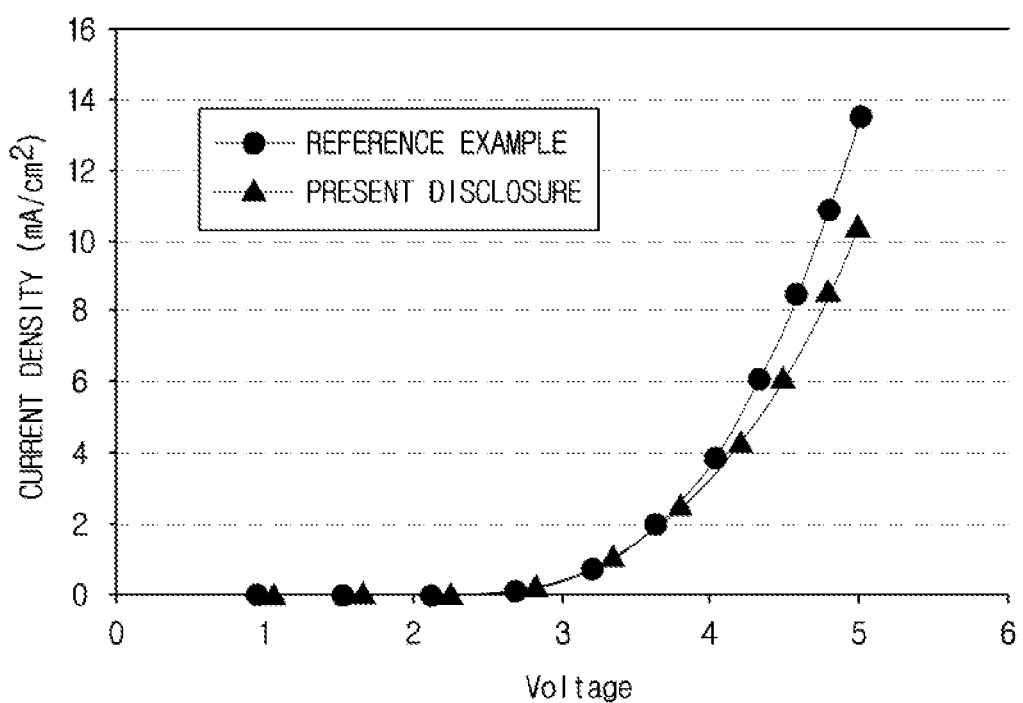
FIG. 11 is a graph illustrating a current density characteristic of an organic light emitting diode in accordance with one embodiment of the present disclosure.

FIG. 8 is a graph illustrating a life time characteristic of an organic light emitting diode in accordance with one embodiment of the present disclosure. FIG. 9 is a graph illustrating a brightness characteristic of an organic light emitting diode in accordance with one embodiment of the present disclosure after a high temperature reliability inspection. FIG. 10 is a table illustrating a quantum efficiency characteristic of an organic light emitting diode in accordance with one embodiment of the present disclosure. FIG. 11 is a graph illustrating a current density characteristic of an organic light emitting diode in accordance with one embodiment of the present disclosure.

Referring to FIGS. 8 through 11, the organic light emitting diode according to one embodiment of the present disclosure enables the hole transport layer HTL and the electron transport layer ETL arranged with having the organic emission layer EML therebetween to have different hole and electron mobilities from each other. As such, the peak electrical-charge density region (or axis) and the central region (or axis) of the hole-electron recombination zone can be formed within the organic emission layer EML in a non-overlapping shape with each other.

When the organic light emitting diode is driven, the hole-electron recombination zone is expanded toward either the hole transport layer (HTL) or the electron transport layer ETL which has a relatively larger mobility. In other words, the hole-electron recombination zone can be expanded up to the peak electrical-charge density region (or axis).

In accordance therewith, the life time of the organic light emitting diode rather extends with the lapse of time T as shown in the drawings. Also, a brightness characteristic curve of the organic light emitting diode driven under a high temperature is almost the same as that of the organic light emitting diode driven under the room temperature. In other words, brightness of the organic light emitting diode in accordance with one embodiment of the present disclosure does not deteriorate after a high temperature reliability inspection, unlike that of the related art.

As seen from FIGS. 10 and 11, the quantum efficiency of the organic light emitting diode in accordance with one embodiment of the present disclosure including a non-overlapping structure of the hole-electron recombination zone and the peak electrical-charge density region has almost the same quantum efficiency as that of the related art.

Also, in current density with respect to the driving voltage, the organic light emitting diode in accordance with one embodiment of the present disclosure shows almost the same characteristic as that of a reference example (or the related art). However, the organic light emitting diode in accordance with one embodiment of the present disclosure provides the current density characteristic with a gentler slope (or inclination) compared to that of the reference example (or the related art). It is clear that this current density characteristic results from the difference between the hole mobility of the hole transport layer HTL and the electron mobility of the electron transport layer ETL.

Figure 12:
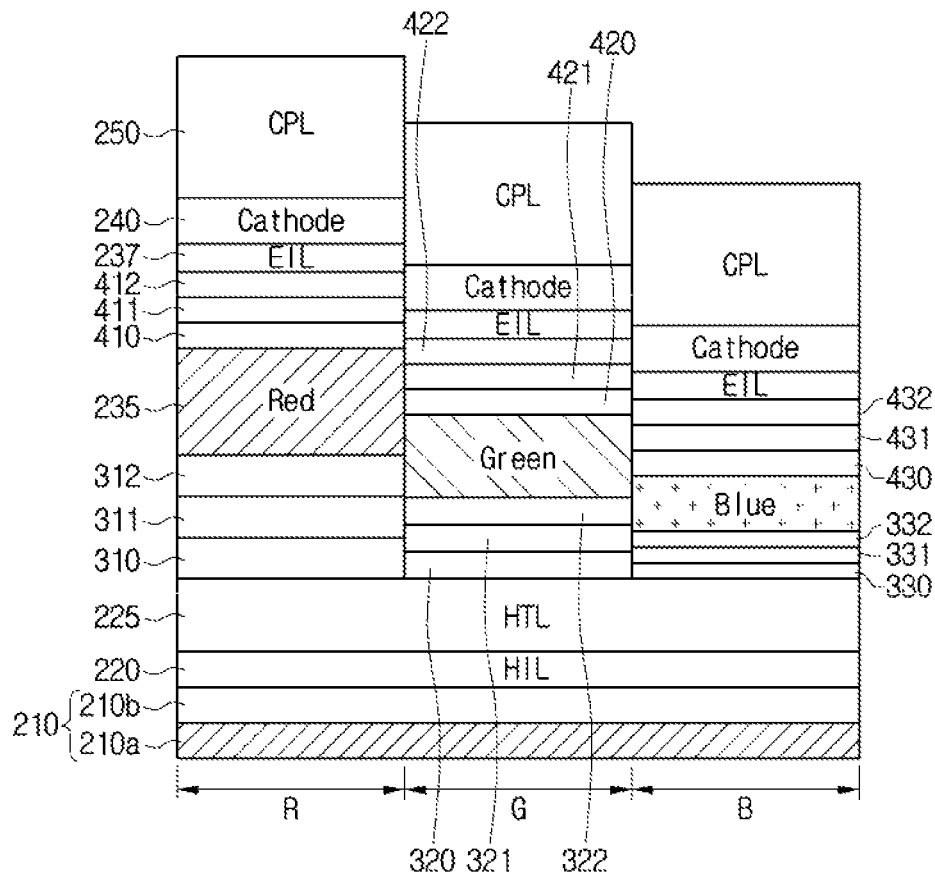
FIG. 12 is a cross-sectional view showing the structure of an organic light emitting display device according to a second embodiment of the present disclosure.
Figure 13A:
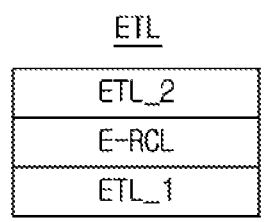
FIGS. 13A and 13B are cross-sectional views showing structures of the hole and electron transport layers in FIG. 12.
Figure 13B:
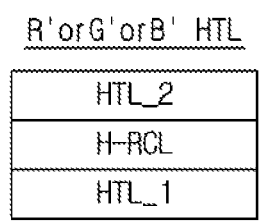

FIG. 12 is a cross-sectional view showing a structure of an organic light emitting display device according to a first embodiment of the present disclosure. FIGS. 13A and 13B are cross-sectional views showing structures of the hole transport layer and the electron transport layer in FIG. 12.

The organic light display device of the second embodiment has the same structure as that of the first embodiment, but allows hole and electron transport layers adjacent to an organic emission layer to be each formed in a multi-layered structure. As such, components of the second embodiment distinguished from those of the first embodiment will be primarily described.

Referring to FIGS. 12, 13A and 13B, the organic light emitting display device according to a second embodiment of the present disclosure allows a first electrode 210 to be formed on the entire surface of a substrate which is defined into red, green and blue regions. The first electrode 210 can be formed in a stacked structure of a first metal layer 210a and a second metal layer 210b. A hole injection layer (HIL) 220 and a first hole transport layer (HTL) 225 each corresponding to all the red, green and blue regions are stacked on the first electrode 210.

The hole injection layer 220 can be formed of one selected from a material group which includes arylamine based compounds, such as NATA, 2T-NATA and NPNPB, and p-doped materials such as F4-TCNQ and PPDN, but it is not limited to this.

The first hole transport layer (HTL) 225 can be formed of one selected a material group of arylamine based compounds, starburst-aromatic-amine-based-materials, spiro-ladder type materials, NPD (N,N-dinaphthyl-N,N'-diphenyl benzidine), s-TAD and MTDATA (4,4',4"-tris(N-3-methylphenyl-N-phenyl-amino)-triphenylamine), but it is not limited to this. The arylamine-based compounds can include TPD (N,N'-bis-(3-methylphenyl)-N,N'-bis-(phenyl)-benzidine), PPD, TTBND, FFD, p-dmDPS and TAPC. The starburst-aromatic-amine-based materials can include TCTA, PTDATA, TDAPB, TDBA, 4-a and TCTA. The spiro-ladder type materials can include spiro-TPD, spiro-mTTB and spiro-2.

A second hole transport layer R'HTL, a third hole transport layer G'HTL 131 and a fourth hole transport layer B'HTL corresponding to the respective red, green and blue sub-pixel regions can be formed on the first hole transport layer (HTL) 225. The second, third and fourth hole transport layers R'HTL, G'HTL and B'HTL can be formed differently from one another in thickness.

The second hole transport layer R'HTL corresponding to the red sub-pixel region can be formed in a stacked structure of first, second and third red hole transport layers 310, 311 and 312. Similarly, the third hole transport layer G'HTL corresponding to the green sub-pixel region can be formed in a stacked structure of first, second and third green hole transport layers 320, 321 and 322, and the fourth hole transport layer B'HTL can be formed in a stacked structure of first, second and third blue hole transport layers 330, 331 and 332.

The first, second and third red hole transport layers 310, 311 and 312, the first, second and third green hole transport layers 320, 321 and 322 and the first, second and third blue hole transport layers 330, 331 and 332 can be formed of the same material as the first hole transport layer 225. Alternatively, the first, second and third red hole transport layers 310, 311 and 312, the first, second and third green hole transport layers 320, 321 and 322 and the first, second and third blue hole transport layers 330, 331 and 332 can be formed of different materials from one another.

As shown in FIG. 13B, the second red hole transport layer (H-RCL) 311 and the first and third red hole transport layers (HTL_1 and HTL_2) 310 and 312 within the red sub-pixel region can be formed of different materials from each other. The first red hole transport layer 310 and the third red hole transport layer 312 can be formed of the same material.

Also, the first, second and third green hole transport layers 320, 321 and 322 within the green sub-pixel region and the first, second and third blue hole transport layers 330, 331 and 332 within the blue sub-pixel region can be formed in the same manner as those of the red sub-pixel region.

Such second, third and fourth hole transport layers R'HTL, G'HTL and B'HTL can be formed of the same material as the first hole transport layer (HTL) 225. Alternatively, the second, third and fourth hole transport layers R'HTL, G'HTL and B'HTL can further contain one of an oligothiophene derivative, an oligocene derivative, a tri-phenylamine derivative and a cabazole derivative, in order to adjust their hole mobility.

In detail, each of the third red, green and blue hole transport layers 312, 322 and 332 adjacent to the organic emission layer 235 can be formed of a material with hole mobility of about $3*10^{-4}$ cm$^2$/Vs, for example.

An organic emission layer 235 is formed on the second, third and fourth hole transport layers R'HTL, G'HTL and B'HTL in red, green, and blue sub-pixel regions. The organic emission layer 235 can be formed of a material which emits visible light by receiving holes and electrons and recombining the holes and the electrons.

The organic emission layer 235 can be defined into red, green and blue emission layers which are formed corresponding to the red, green and blue sub-pixel regions. Also, the red, green and blue emission layers can be formed differently from one another in thickness.

An electron transport layer ETL is formed on the organic emission layer 235. Also, an electron injection layer (EIL) 237 is formed on the electron transport layer ETL.

The electron transport layer ETL can be defined into red, green and blue electron transport layers corresponding to the respective red, green and blue sub-pixel regions. The red electron transport layer can be formed in a stacked structure of first, second and third red electron transport layers 410, 411 and 412. Similarly, the green electron transport layer can be formed in a stacked structure of first, second and third green electron transport layers 420, 421 and 422 and the blue electron transport layer can be formed in a stacked structure of first, second and third blue electron transport layers 430, 431 and 432, The electron transport layer ETL can be used to easily and smoothly transport the electrons. Also, the electron transport layer ETL can be formed of at least one selected from a material group which includes Alq3 (tris(8-hydroxyquinolinato)aluminum), PBD, TAZ, spiro-PBD, BAlq and SAlq, but it is not limited to this.

In order to adjust the electron mobility, the electron transport layer ETL can further contain one of a perylene derivative, tetrathia fulvalene derivative, a fullerene derivative, a diazole derivative and an imidazole derivative.

As shown in FIG. 13A, the second red electron transport layer (E-RCL) 411 and the first and third red electron transport layers (ETL_1 and ETL_2) 410 and 412 within the red sub-pixel region can be formed of different materials from each other. The first red electron transport layer 410 and the third red electron transport layer 412 can be formed of the same material.

Also, the first, second and third green hole transport layers 320, 321 and 322 within the green sub-pixel region and the first, second and third blue hole transport layers 330, 331 and 330 within the blue sub-pixel region can be formed in the same manner as those of the red sub-pixel region.

Also, the first, second and third green electron transport layers 420, 421 and 422 within the green sub-pixel region and the first, second and third blue electron transport layers 430, 431 and 432 within the blue sub-pixel region can be formed in the same manner as those of the red sub-pixel region.

Such first red, green and blue electron transport layers 410, 420 and 430 adjacent to the organic emission layer 235 can be each formed of a material with electron mobility of about $6.6*10^{-8}$ cm$^2$/Vs, for example.

Particularly, the organic light emitting display device of the present disclosure enables a peak recombination density region formed within the organic emission layer 235 not to overlap with a peck charge density region. To this end, the hole mobilities of the second, third and fourth hole transport layers R'HTL, G'HTL and B'HTL can be set differently from the electron mobility of the electron transport layer ETL.

A second electrode 240 is formed on the electron injection layer 237. A capping layer (CPL) 250 is formed on the second electrode 240.

As described above, the organic light emitting display device in accordance with one embodiment of the present disclosure can expand the hole-electron recombination zone of the organic emission layer toward the peak electrical-charge density region (or axis) using the difference between the hole mobility of the hole transport layer and the electron mobility of the electron transport layer, when the organic light emitting diode is driven. In accordance therewith, the organic light emitting display device can enhance the high temperature reliability of the organic light emitting diode and expand the life time of the organic light emitting diode.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display device comprising:
   a first electrode including red, green and blue sub-pixel regions;
   a first hole injection layer disposed on the first electrode;
   a first hole transport layer disposed on the hole injection layer;
   second, third and fourth hole transport layers arranged on the first hole transport layer corresponding to the red, green and blue regions, respectively;
   an organic emission layer disposed on the second, third and fourth hole transport layers;
   an electron transport layer disposed on the organic emission layer; and
   a second electrode disposed on the electron transport layer,
   wherein the second, third and fourth hole transport layers each have a hole mobility different from an electron mobility, of the electron transport layer, and wherein the organic light emitting display device enables a peak electrical-charge density region and a peak recombination density region within the organic emission layer not to overlap with each other using a difference between the hole and electron mobilities of the hole and electron transport layers, and the peak recombination density region corresponds to a highest density region of recombined electron-hole pairs.

2. The organic light emitting display device of claim 1, wherein the organic emission layer includes a central region of a hole-electron recombination zone shifted without overlapping with a peak electrical-charge density region.

3. The organic light emitting display device of claim 2, wherein the central region of the hole-electron recombination zone is shifted from the peak electrical-charge density region toward the electron transport layer.

4. The organic light emitting display device of claim 3, wherein the second, third and fourth hole transport layers each have a larger hole mobility than the electron mobility of the electron transport layer.

5. The organic light emitting display device of claim 2, wherein the central region of the hole-electron recombination zone is shifted from the peak electrical-charge density region toward the second, third and fourth hole transport layers.

6. The organic light emitting display device of claim 5, wherein the second, third and fourth hole transport layers each have a smaller hole mobility than the electron mobility of the electron transport layer.

7. The organic light emitting display device of claim 1, wherein the second, third and fourth hole transport layers adjacent to the organic light emission layer each include at least one of an oligothiophene derivative, an oligocene derivative, a tri-phenylamine derivative and a cabazole derivative.

8. The organic light emitting display device of claim 1, wherein the second, third and fourth hole transport layers adjacent to the organic light emission layer each have the hole mobility of about $3*10^{-4}$ cm$^2$/Vs.

9. The organic light emitting display device of claim 1, wherein the electron transport layer adjacent to the organic emission layer includes at least one of a perylene derivative, tetrathia fulvalene derivative, a fullerene derivative, a diazole derivative and an imidazole derivative.

10. The organic light emitting display device of claim 1, wherein the electron transport layer adjacent to the organic emission layer has the electron mobility of about $6.6*10^{-8}$ cm$^2$/Vs.

11. An organic light emitting display device comprising:
    a first electrode including red, green and blue sub-pixel regions;
    a first hole injection layer disposed on the first electrode;
    a first hole transport layer disposed on the hole injection layer;
    second, third and fourth hole transport layers arranged on the first hole transport layer corresponding to the red, green and blue regions, each of the second, third, and fourth hole transport layers being formed in a stacked structure of a plurality of transport layers;
    an organic emission layer disposed on the second, third and fourth hole transport layers;
    an electron transport layer disposed on the organic emission layer and formed in a stacked structure of a plurality of layers; and
    a second electrode disposed on the electron transport layer,
    wherein the second, third and fourth hole transport layers each have a hole mobility different from an electron mobility of the electron transport layer, and wherein the organic light emitting display device enables a peak electrical-charge density region and a peak recombination density region within the organic emission layer not to overlap with each other using a difference between the hole and electron mobilities of the hole and electron transport layers, and the peak recombination density region corresponds to a highest density region of recombined electron-hole pairs.

12. The organic light emitting display device of claim 11, wherein the organic emission layer includes a central region of a hole-electron recombination zone shifted without overlapping with a peak electrical-charge density region.

13. The organic light emitting display device of claim 12, wherein the central region of the hole-electron recombination zone is shifted from the peak electrical-charge density region toward the electron transport layer.

14. The organic light emitting display device of claim 13, wherein the second, third and fourth hole transport layers each have a larger hole nobility than the electron mobility of the electron transport layer.

15. The organic light emitting display device of claim 12, wherein the central region of the hole-electron recombination zone is shifted from the peak electrical-charge density region toward the second, third and fourth hole transport layers.

16. The organic light emitting display device of claim 15, wherein the second, third and fourth hole transport layers each have a smaller hole mobility than the electron mobility of the electron transport layer.

17. The organic light emitting display device of claim 11, wherein transport layers included in the stacked structure of the second, third and fourth hole transport layers and disposed adjacently to the organic light emission layer each include at least one of an oligothiophene derivative, an oligocene derivative, a tri-phenylamine derivative and a cabazole derivative.

18. The organic light emitting display device of claim 11, wherein transport layers included in the stacked structure of the second, third and fourth hole transport layers and disposed adjacently to the organic light emission layer each have the hole mobility of about $3 \times 10^{-4}$ cm$^2$/Vs.

19. The organic light emitting display device of claim 11, wherein a layer included in the stacked structure of the electron transport layer and disposed adjacently to the organic light emission layer includes at least one of a perylene derivative, tetrathia fulvalene derivative, a fullerene derivative, a diazole derivative and an imidazole derivative.

20. The organic light emitting display device of claim 11, wherein a layer included in the stacked structure of the electron transport layer and disposed adjacently to the organic light emission layer has the electron mobility of about $6.6 \times 10^{-8}$ cm$^2$/Vs.

* * * * *